(12) United States Patent
Lin et al.

(10) Patent No.: US 6,890,803 B2
(45) Date of Patent: May 10, 2005

(54) METHOD FOR FORMING A THIN FILM TRANSISTOR OF AN ORGANIC LIGHT EMITTING DISPLAY

(75) Inventors: Han-Tu Lin, Tai-Chung Hsien (TW); Han-Chung Lai, Tao-Yuan Hsien (TW)

(73) Assignee: AU Optronics Corp., Hsin-Chu (TW)

( * ) Notice: Subject to any disclaimer, the term of this patent is extended or adjusted under 35 U.S.C. 154(b) by 0 days.

(21) Appl. No.: 10/604,686

(22) Filed: Aug. 11, 2003

(65) Prior Publication Data

US 2004/0235224 A1 Nov. 25, 2004

(30) Foreign Application Priority Data

May 20, 2003 (TW) ........................................ 92113643 A

(51) Int. Cl.⁷ .............................................. H01L 21/00
(52) U.S. Cl. ........................... 438/149; 438/30; 438/150
(58) Field of Search ....................... 438/29–30, 149–151

(56) References Cited

U.S. PATENT DOCUMENTS

| | | | | |
|---|---|---|---|---|
| 5,311,040 A | * | 5/1994 | Hiramatsu et al. ............. | 257/57 |
| 6,674,502 B1 | * | 1/2004 | Terakado et al. ............ | 349/147 |
| 6,731,364 B2 | * | 5/2004 | Takahashi et al. ........... | 349/139 |
| 2004/0119072 A1 | * | 6/2004 | Lee et al. ..................... | 257/72 |

* cited by examiner

Primary Examiner—Thanh Nguyen
(74) Attorney, Agent, or Firm—Winston Hsu

(57) ABSTRACT

A method for forming a thin film transistor of an organic light emitting display includes depositing a first metal layer on a substrate, performing a photo-etching-process (PEP) to form a gate of the TFT on the substrate, forming a gate insulating layer, a microcrystalline silicon layer, an amorphous silicon layer, and a doped n⁺ layer sequentially, and then performing a second PEP to remove a portion of the doped n⁺ layer, the amorphous silicon layer, and the microcrystalline silicon layer. The method further includes forming a second metal layer, performing a third PEP to form a source and a drain on the substrate and to simultaneously remove a portion of the doped n⁺ layer to expose the amorphous silicon layer, and finally, forming a passivation layer on the substrate.

24 Claims, 6 Drawing Sheets

METHOD FOR FORMING A THIN FILM TRANSISTOR OF AN ORGANIC LIGHT EMITTING DISPLAY

BACKGROUND OF INVENTION

1. Field of the Invention

The invention relates to a method for forming a thin film transistor (TFT) of an organic light-emitting display (OLED), and more particularly, to a method for forming a TFT that can solve the problem of threshold voltage shifting of the gate of a TFT.

2. Description of the Prior Art

Since the progress of science and technology has led to small, effective, and portable intelligent information products, display devices have played an important role in modern society. In recent years, display devices have undergone great improvements in the areas of high performance quality, larger size, and lower cost. Among the various display devices in the display market, OLEDsare poised replace liquid crystal displays (LCD) and cathode ray tube (CRT) displays, as they have advantages of simpler structures, self-emitting design, excellent operating temperature, high definition, high contrast, and a wide viewing angle. OLEDs can be applied to mobile phones, personal digital assistants (PDAs), hand-held videogames, digital cameras, portable DVD players, and automobile navigation devices.

An OLED uses organic luminous devices, such as organic light-emitting diodes, as the light source of the display. An organic luminous device is an electrically driven lighting element having a brightness that depends on the magnitude of a related current. At present, the magnitude of the brightness (which is also called the gray-scale value) is controlled by the magnitude of the driving current in an application organic light-emitting matrix display. As a result, the OLED utilizes this characteristic of the organic luminous material to generate red, blue, and green lights with different intensities of gray level to produce stunning images.

Based on the driving method, the matrix display can be classified as either a passive matrix or an active matrix display. Passive matrix displays adopt the method of driving the scan lines of the display in sequence, driving pixels in different rows sequentially. Since the light-emitting time of each pixel is restricted by the scanning frequency and the numbers of scan lines, the passive matrix method is not suitable for large-sized and high dots-per-inch (dpi) displays with a high amount of scan lines. Active matrix displays, however, possess an independent pixel circuit for each pixel, which includes a capacitor (Cs), an organic light-emitting component, and at least two TFTs that are used to adjust the OLED driving current. With this arrangement, even in large-sized and high dpi displays, a steady driving current is provided for each pixel, which improves the brightness balance.

FIG. 1 is a schematic diagram of an active matrix OLED panel 10 according to the prior art. As shown in FIG. 1, a display panel 12 comprises a matrix composed of a plurality of data lines 22 (such as DL1, DL2, and DL3) and scan lines 24 (such as SL1 and SL2). The display panel 12 also comprises a plurality of pixel circuits 26 having TFTs, a storage capacitor (Cs), and organic luminous devices (not shown) at each intersection of a data line 22 and a scan line 24. Each pixel circuit 26 electrically connects to a corresponding data line 22 and a corresponding scan line 24 for driving the organic light-emitting diode 20 in the corresponding pixel. The data lines DL1, DL2, and DL3 connect to an external data line driver 16 for receiving an image data signal, and the scan lines SL1 and SL2 connect to an external scan line driver 18 for receiving a switch/address signal.

FIG. 2 is a schematic diagram of the pixel circuit 26 shown in FIG. 1. As shown in FIG. 2, the pixel circuit 26 comprises a first TFT 28, a second TFT 30, and a storage capacitor 32. In the prior art, generally, the first TFT 28 and second TFT 30 are NMOS transistors. The gate of the first TFT 28 is electrically connected to the scan line 24, and the source, point A, of the first TFT 28 is electrically connected to the data line 22. In addition, the gate, point B, of the second TFT 30 is electrically connected to the source of the first TFT 28 and one end of the storage capacitor 32. And the source, point C, and the drain, point D, of the second TFT 30 are electrically connected to an external power supply Vdd and the organic luminous device 20 respectively.

The driving method of the conventional OLED 10 is described in the following. Referring to FIG. 1 and FIG. 2, when a video data signal is inputted into a control circuit 14, the control circuit 14 generates corresponding control signals to the data line control circuit 16 and the scan line driving circuit 18 according to the video data of each pixel. Then, the scan line driving circuit 18 outputs corresponding scan signals to each scan line 24 (SL1, SL2, . . . and SLn) in sequence for turning on the pixel circuits 26 in each row in order and thereby making the corresponding pixels perform the display operation. For example, when the OLED 10 is going to drive a pixel positioned in the intersection of DL3 and SL3, the control circuit 14 sends a corresponding data signal, normally a voltage signal with a predetermined intensity, to the drain of the first TFT 28 in the pixel circuit 26 through the data line driving circuit 16 and the data line 22 according to the video data.

Since the first TFT 28 and the second TFT 30 both conduct, the current from the data line 22 will charge the storage capacitor 32 with the first TFT 28. After that, the storage capacitor 32 has a first voltage and generates a corresponding driving current at point C, which is then output to the organic luminous device 20 to make the organic luminous device 20 generate light beams with a corresponding brightness. When the OLED 10 performs in continuous operation, such as driving the pixels in the next row, the storage capacitor 32 still has the first voltage although the voltage on SL3 decreases resultingin the first TFT 28 becoming closed. Therefore, the second TFT 30 still conducts. Furthermore, since there is a voltage difference between point D and point C, a current is continuously passing through the second TFT 30 to the organic luminous device 20 to continuously keep the organic luminous device 20 emitting light beams. Since a pixel circuit may have various design structures, the amount of TFTs in a pixel circuit may be different. However, a pixel circuit contains at least two TFTs for driving the organic luminous device.

In the driving method of an OLED as described above, the pixel circuit used for driving the organic luminous device is one of the key devices for displaying video data on time and correctly. In addition, since the TFT is the main element for conducting the pixel circuit and controlling the organic luminous device to continually emit light, normally the quality of a TFT is a key factor in the performance of an organic light emitting display.

Generally, the TFTs of the pixels in the prior-art OLEDS are NMOS transistors. According to the prior art, the process of fabricating such an NMOS transistor is to form a gate on a glass substrate, to deposit a gate insulating (GI) layer, an amorphous silicon layer, and a doped n+ layer in sequence, and to remove portions of the doped n+ layer and the amorphous silicon layer to define the gate pattern. Then, an indium tin oxide (ITO) layer is formed on the glass substrate. After that, a portion of the ITO layer is removed to form the pixel electrodes. Following that, a metal layer is formed on the doped n+ layer, and a photoetching-process (PEP) is performed to remove a portion of the metal layer and the doped n+ layer to form a source and a drain, and to simultaneously expose a portion of the amorphous silicon layer. Finally, a passivation layer is formed on the source and the drain, and then a portion of the passivation layer is removed to finish the fabrication of the TFT of an OLED.

However, according to the prior art, the amorphous silicon layer is composed of silicon molecules that are not crystallized, so that the amorphous silicon layer has low electron mobility. Furthermore, the threshold voltage of the gate of a TFT with amorphous silicon material will shift depending on the fabrication process, which will result in each TFT having an uncertain gate threshold voltage. In this situation, various driving currents will be output resulting in uneven brightness, as each organic luminous device will have a differing gray-scale value. This is especially so when the TFT is under a long-time operation, as electrons may remain in the amorphous silicon layer. As a result, a voltage stress on the TFT is generated, leading to an increased uncertainty in the threshold voltages of gates that seriously degrades the display quality of the OLED.

To avoid such threshold voltage shifting, a great majority of OLED manufactures use low temperature polysilicon thin film transistors (LTPS TFT). However, the process for fabricating an LTPS TFT is more complicated and has significantly higher costs. As a result, how to produce a TFT with a stable gate threshold voltage using simple processes and using a low-cost hydrogenated amorphous silicon layer ($\alpha$-Si:H layer) is an important issue.

SUMMARY OF INVENTION

It is therefore one object of the present invention to provide a method for fabricating a TFT of an OLED that can solve the above-mentioned problem of uneven brightness resulting from the shifting threshold voltage of the gate.

According to the present invention, a method of forming a TFT of an OLED comprises providing a substrate; depositing a first metal layer on the substrate; performing a first PEP to remove a portion of the first metal layer so as to form a gate of the TFT on the surface of the substrate; forming a gate insulating layer on the gate; forming a microcrystalline silicon layer, an amorphous silicon layer, and a doped n+ layer in sequence on the gate insulation layer; performing a second PEP to remove a portion of the doped n+ layer, the amorphous silicon layer, and the microcrystalline silicon layer; forming a second metal layer on the substrate; performing a third PEP to form a source and a drain of the TFT on the surface of the substrate and simultaneously to remove a portion of the doped n+ layer to expose the amorphous silicon layer; and forming a passivation layer on the substrate.

It is an advantage of the present invention that the method comprises forming a microcrystalline silicon layer on the gate insulating layer, which results in reduced threshold voltage shifting of the gate. Therefore, the performance quality of the OLED can be improved, and the lifetime of the OLED can be extended.

These and other objects of the present invention will be apparent to those of ordinary skill in the art after having read the following detailed description of the preferred embodiment that is illustrated in the various figures and drawings.

DETAILED DESCRIPTION

Figure 1:
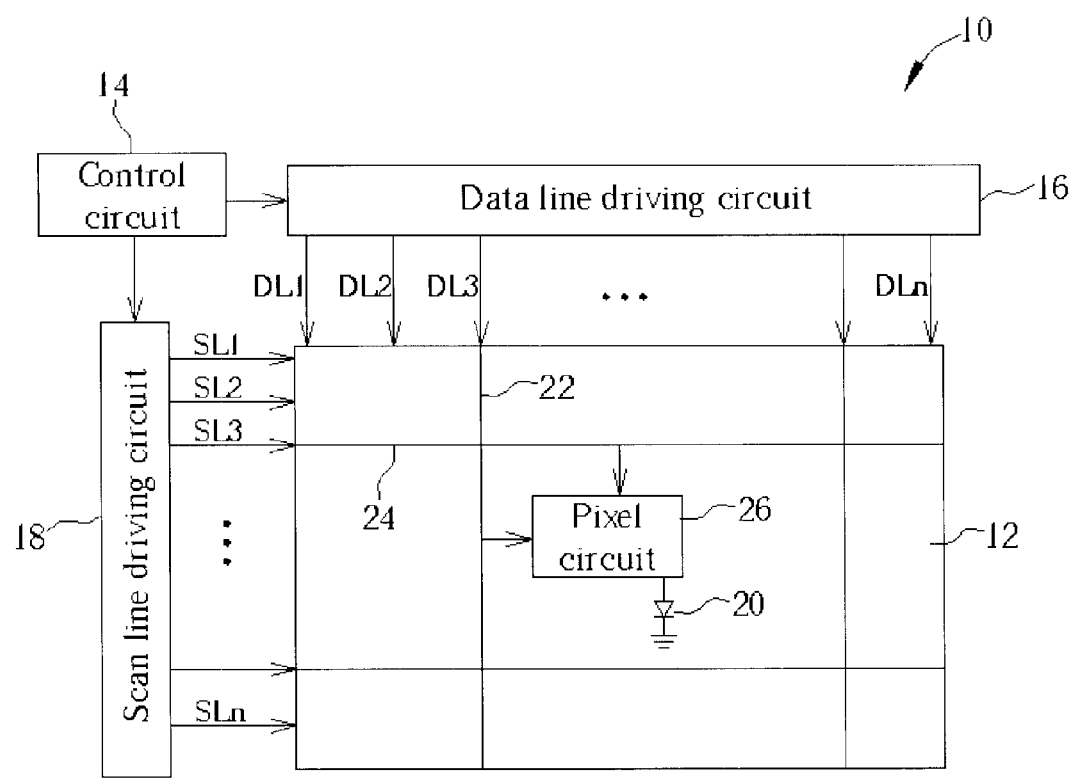
FIG. 1 is a schematic diagram of an active matrix OLED panel according to the prior art.
Figure 2:
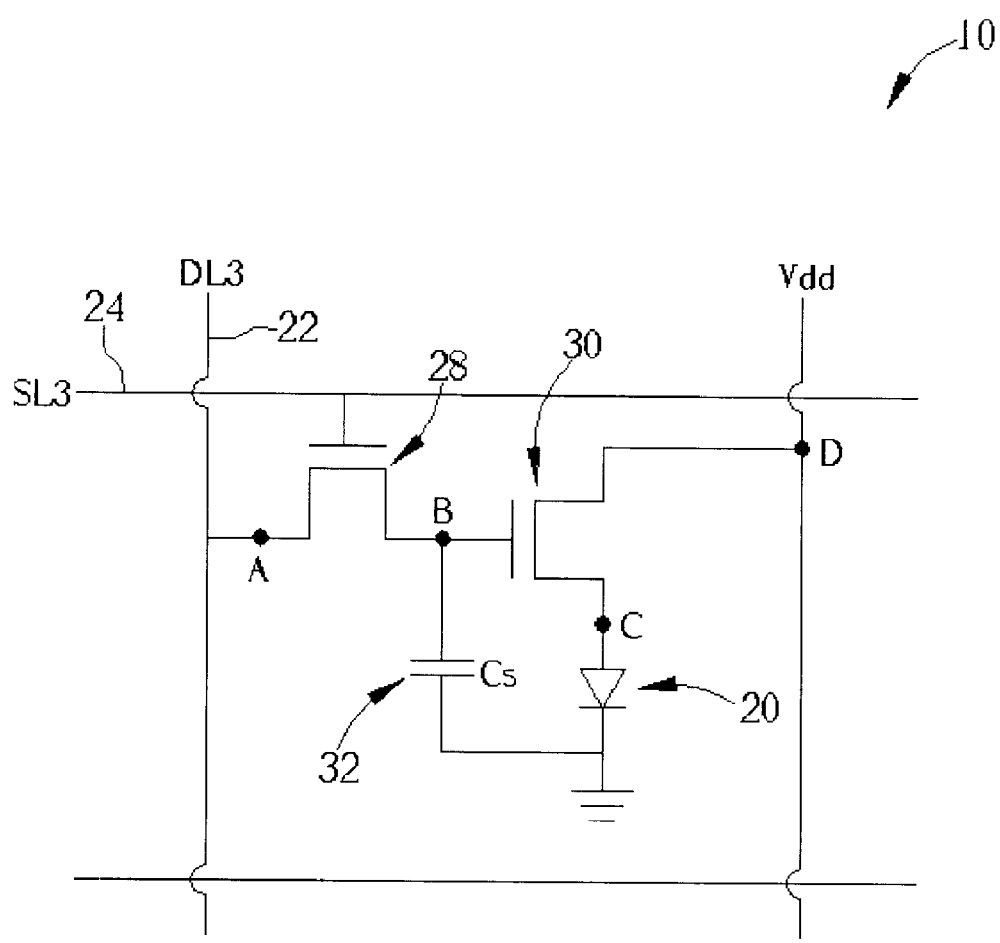
FIG. 2 is a schematic diagram of the pixel circuit shown in FIG. 1.
Figure 3:
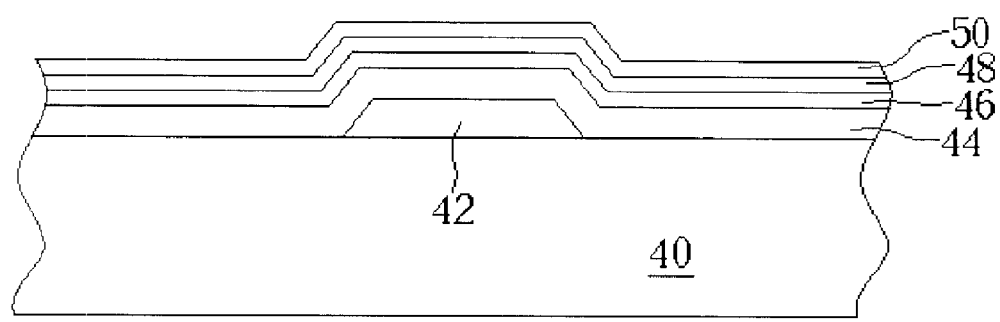
FIGS. 3–6 are schematic diagrams of the method of forming a TFT of an OLED according to the present invention.

FIGS. 3–6 are schematic diagrams of the method of forming a TFT of an OLED according to the present invention. As shown in FIG. 3, a first metal layer is first deposited on a substrate 40, and then a first PEP is performed to remove a portion of the first metal layer to form a gate 42 of the TFT on the surface of the substrate 40. The substrate 40 is a glass substrate, a quartz substrate, or a plastic substrate. The gate 42 is composed of tungsten (W), aluminum (Al), chromium (Cr), copper (Cu), molybdenum (Mo), or an alloy of any of the above metal materials.

Following this, a gate insulating layer 44 composed of silicon oxide ($SiO_x$, such as $SiO_2$), silicon nitride ($SiN_y$), or silicon oxynitride (SiON) is formed on the gate 42. Then, a microcrystalline silicon layer 46, an amorphous silicon layer 48, and a doped n+ layer 50 are sequentially formed on the gate insulating layer 44. The gate insulating layer 44, the microcrystalline silicon layer 46, and the amorphous silicon layer 48 are both formed by the same plasma enhanced chemical vapor deposition (PECVD) process with continuous deposition.

Figure 4:
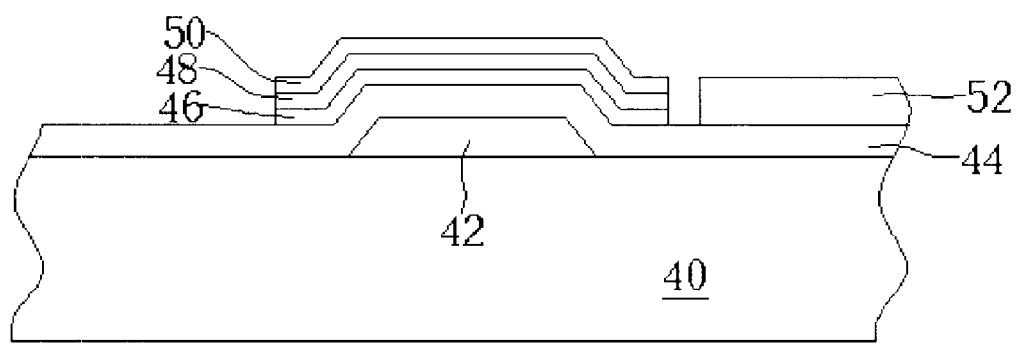
Figure 5:
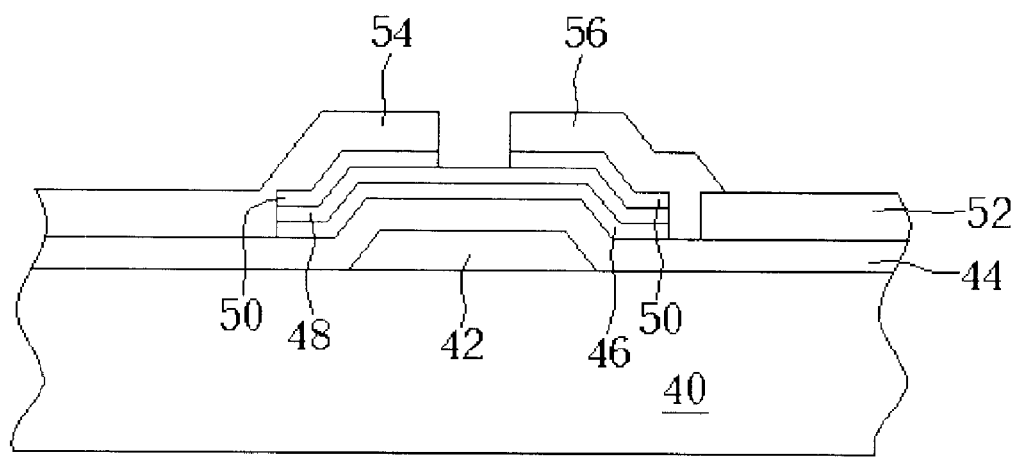
Figure 6:
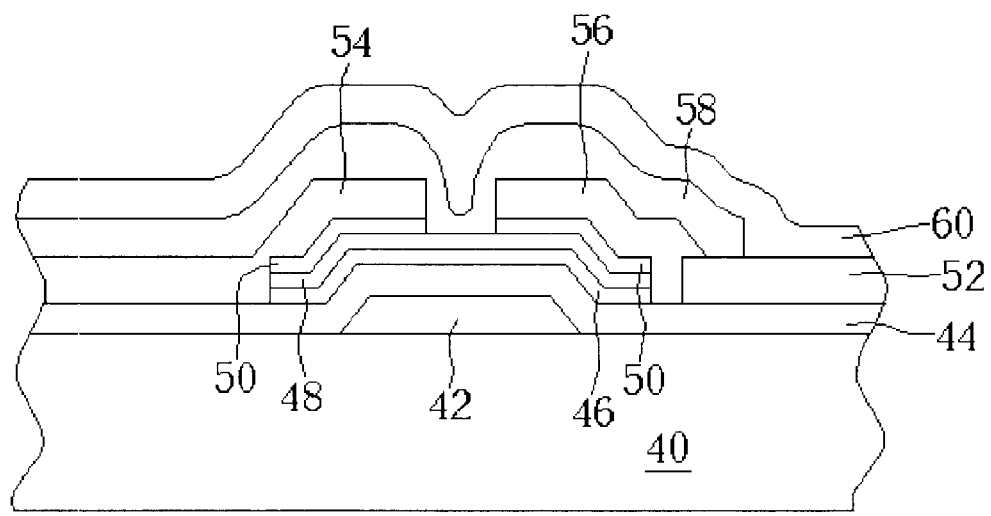

Referring to FIG. 4, a second PEP is performed to remove a portion of the doped n+ layer 50, the amorphous silicon layer 48, and the microcrystalline silicon layer 46. Then, an ITO layer 52 is formed on the substrate 40 with a following third PEP performed to remove a portion of the ITO layer 52. As shown in FIG. 5, a second metal layer (not shown) of tungsten, chromium, aluminum, copper, molybdenum, or an alloy of any of these materials is formed on the substrate 40. A forth PEP is performed to remove a portion of the second metal layer and the doped n+ layer 50 to form a source 54 and a drain 56, and to simultaneously expose a portion of the amorphous silicon layer 48. Referring to FIG. 6, a passivation layer 58 is formed on the substrate 40, wherein the passivation layer 58 comprises silicon oxide or silicon nitride. Finally, a fifth PEP is performed to remove a portion of the passivation layer 58 to complete fabrication of the TFT of the OLED. After that, several following processes, such as depositing an organic light-emitting layer 60, can be sequentially performed to continue manufacturing the OLED.

It should be noted that the thickness of the microcrystalline silicon layer 46 according to the present invention is preferably about 50~500 angstroms (Å). Besides that, when performing the PECVD process to form the microcrystalline silicon layer 46, it is preferable that the power density of the PECVD process should be controlled to be under 0.54 w/cm$^2$. Furthermore, the crystallization ratio ($f_c$) of the microcrystalline silicon layer 46 has to be more than 40% to meet the requirement of stable electricity. The crystallization ratio can be calculated by the Fourier Transform infrared (FTIR) with the integral area ratio of the absorption peak being 2100 cm$^{-1}$ and 1900 cm$^{-1}$. This equation is as below:

$f_c=I_{2100}/[(I_{2100}+I_{1900})]$

In a second embodiment of the present invention method, a surface treatment is performed after the gate insulating layer 44 is deposited. Therefore, the microcrystalline silicon layer 46 is deposited after the gate insulating layer 44 is treated. This is because the microcrystalline silicon layer 46 will be formed favorably if the interface between the gate insulating layer 44 and the microcrystalline silicon layer 46 contains more oxygen-containing molecules. In this embodiment, a nitrous oxide ($N_2O$) plasma treatment is performed, which results in the gate insulating layer 44 having stronger oxygen bonding with the subsequently formed microcrystalline silicon layer 46 and a stable interface of the gate insulating layer 44 and the microcrystalline silicon layer 46. In addition, the surface treatment process can be an oxygen-containing plasma treatment that also provides stronger oxygen bonding between the gate insulating layer 44 and the microcrystalline silicon layer 46. The oxygen-containing gas of the oxygen-containing plasma process comprises nitric oxide (NO), nitrous oxide ($N_2O$), nitrogen dioxide ($NO_2$), hydrogen peroxide ($H_2O_2$), oxygen ($O_2$), ozone ($O_3$), or tetra-ethyl-ortho-silicate (TEOS).

According to a third embodiment of the present invention, the gate insulating layer 44 and the microcrystalline silicon layer 46 are formed by an interrupted deposition. For example, after performing a PECVD process to form the gate insulating layer 44, the substrate 40 is moved out of the reaction chamber, and moved into the original reaction chamber or a different reaction chamber to perform the deposition of the microcrystalline silicon layer 46. According to these processes of forming the microcrystalline silicon layer 46, the TFT is given better stability to effectively reduce the shifting influence of the threshold voltage of the gate of a TFT.

In contrast to the prior art, the present invention method of forming a TFT of an OLED uses a hydrogenated amorphous silicon layer (α-Si:H layer) and a simple low-cost process to form a microcrystalline silicon layer between the gate insulating layer and the amorphous silicon layer. The crystallization ability of the microcrystalline silicon layer solves the problem of threshold voltage shifting seen in the prior art having only one amorphous silicon layer in the gate. Therefore, the process parameters mentioned above can be taken for forming a preferable microcrystalline silicon layer, and further, to avoid the threshold voltage shifting of the gate. As a result, low quality image performance resulting from threshold voltage shifting or long-time operation can be improved, and furthermore, the lifetime of the OLED can be lengthened. A large-sized OLED with high performance quality can be manufactured with low cost according to the present invention.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for forming a thin film transistor (TFT) of an organic light emitting display (OLED), the method comprising the steps of:
   providing a substrate;
   depositing a first metal layer on the substrate;
   performing a first photo-etching process (PEP) to remove a portion of the first metal layer to form a gate of the TFT on the surface of the substrate;
   forming a gate insulating layer on the gate;
   depositing a microcrystalline silicon layer on the gate insulation layer;
   forming an amorphous silicon layer on the microcrystalline silicon layer;
   forming a doped n+ layer on the amorphous silicon layer;
   performing a second PEP to remove a portion of the doped n+ layer, the amorphous silicon layer, and the microcrystalline silicon layer;
   forming a second metal layer on the substrate;
   performing a third PEP to form a source and a drain of the TFT on the surface of the substrate, and simultaneously to remove a portion of the doped n+ layer to expose the amorphous silicon layer; and
   forming a passivation layer on the substrate.

2. The method of claim 1, wherein the substrate is selected from the group consisting of a glass substrate, a quartz substrate, and a plastic substrate.

3. The method of claim 1, wherein the first metal layer and the second metal layer are composed of tungsten (W), chromium (Cr), aluminum (Al), copper (Cu), molybdenum (Mo), or an alloy of any of the above metals.

4. The method of claim 1, wherein the gate insulating layer is formed with a plasma enhanced chemical vapor deposition (PECVD) process, the gate insulating layer comprising silicon oxide ($SiO_x$), silicon nitride ($SiN_y$), or silicon oxynitride (SiON).

5. The method of claim 1, further comprising the step of performing a nitrous oxide ($N_2O$) plasma process for treating the surface of the gate insulating layer.

6. The method of claim 1, further comprising the step of performing an oxygen-containing plasma process for treating the surface of the gate insulating layer.

7. The method of claim 6, wherein an oxygen-containing gas of the oxygen-containing plasma process comprises nitric oxide ($NO_x$), hydrogen peroxide ($H_2O_2$), oxygen ($O_2$), ozone ($O_3$), or tetra-ethyl-ortho-silicate (TEOS).

8. The method of claim 1, wherein the microcrystalline silicon layer is formed with a PECVD process, and the power density of the PECVD process is less than 0.54 $w/cm^2$.

9. The method of claim 8, wherein a thickness of the microcrystalline silicon layer is approximately 50 to 500 angstroms (Å), and a crystallization ratio ($f_c$) of the microcrystalline silicon layer is more than 40%.

10. The method of claim 1, wherein the gate insulating layer, the microcrystalline silicon layer, and the amorphous silicon layer are formed by a same PECVD process with continuous deposition.

11. The method of claim 1, wherein the gate insulating layer and the microcrystalline silicon layer are deposited by a PECVD process with interrupted deposition.

12. The method of claim 1, wherein the passivation layer comprises silicon oxide or silicon nitride.

13. A method for forming a TFT of an OLED, the method comprising the steps of:
   providing a substrate;
   depositing a first metal layer on the substrate;
   performing a first PEP to remove a portion of the first metal layer to form a gate of the TFT on the surface of the substrate;
   forming a gate insulating layer on the gate;
   performing a surface treatment to the surface of the gate insulating layer;
   forming a microcrystalline silicon layer on the gate insulating layer;

forming an amorphous silicon layer on the microcrystalline silicon layer;

forming a doped n+ layer on the amorphous silicon layer;

performing a second PEP to remove a portion of the doped n+ layer, the amorphous silicon layer, and the microcrystalline silicon layer;

forming a second metal layer on the substrate;

performing a third PEP to form a source and a drain of the TFT on the surface of the substrate, and simultaneously to remove a portion of the doped n+ layer for exposing the amorphous silicon layer; and forming a passivation layer on the substrate.

14. The method of claim 13, wherein the surface treatment is a nitrous oxide ($N_2O$) plasma process.

15. The method of claim 13, wherein the surface treatment is an oxygen-containing plasma process.

16. The method of claim 15, wherein an oxygen-containing gas of the oxygen-containing plasma process comprises nitric oxide ($NO_x$), hydrogen peroxide ($H_2O_2$), oxygen ($O_2$), ozone ($O_3$), or tetra-ethyl-ortho-silicate (TEOS).

17. The method of claim 13, wherein the substrate is selected from the group consisting of a glass substrate, a quartz substrate, and a plastic substrate.

18. The method of claim 13, wherein the first metal layer and the second metal layer are composed of tungsten, chromium, aluminum, copper, molybdenum, or an alloy of any of the above metals.

19. The method of claim 13, wherein the gate insulating layer is formed with a PECVD process, and the gate insulating layer comprises silicon oxide, silicon nitride, or silicon oxynitride.

20. The method of claim 13, wherein the microcrystalline silicon layer is formed by a PECVD process, and a power density of the PECVD process is less than 0.54 w/cm$^2$.

21. The method of claim 20, wherein a thickness of the microcrystalline silicon layer is approximately 50 to 500 angstroms (Å), and a crystallization ratio ($f_c$) of the microcrystalline silicon layer is more than 40%.

22. The method of claim 13, wherein the gate insulating layer, the microcrystalline silicon layer, and the amorphous silicon layer are formed by a same PECVD process with continuous deposition.

23. The method of claim 13, wherein the gate insulating layer and the microcrystalline silicon layer are formed by a PECVD process with interrupted deposition.

24. The method of claim 13, wherein the passivation layer comprises silicon oxide or silicon nitride.

* * * * *